United States Patent
Huang et al.

(10) Patent No.: US 8,691,705 B2
(45) Date of Patent: Apr. 8, 2014

(54) METHOD OF PATTERNING METAL ALLOY MATERIAL LAYER HAVING HAFNIUM AND MOLYBDENUM

(75) Inventors: Chih-Wei Huang, Taoyuan County (TW); Chao-Sung Lai, Taoyuan County (TW); Hsing-Kan Peng, Hsinchu County (TW); Chung-Yuan Lee, Taoyuan County (TW); Shian-Jyh Lin, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 55 days.

(21) Appl. No.: 13/118,604

(22) Filed: May 31, 2011

(65) Prior Publication Data

US 2011/0226736 A1    Sep. 22, 2011

Related U.S. Application Data

(63) Continuation of application No. 12/103,681, filed on Apr. 15, 2008, now abandoned.

(30) Foreign Application Priority Data

Dec. 7, 2007   (TW) .............................. 96146920 A

(51) Int. Cl.
*H01L 21/302* (2006.01)
*H01L 21/461* (2006.01)

(52) U.S. Cl.
USPC .......................................... 438/745; 438/754

(58) Field of Classification Search
CPC .............................. C23F 1/26; H01L 21/32134
USPC ......... 252/79.3; 216/41, 83, 95, 96, 101, 108, 216/109; 438/745
See application file for complete search history.

(56) References Cited

U.S. PATENT DOCUMENTS

| | | | | |
|---|---|---|---|---|
| 3,136,633 A | * | 6/1964 | Berry | 420/508 |
| 4,581,102 A | * | 4/1986 | Brock | 216/107 |
| 2003/0230548 A1 | * | 12/2003 | Sievert et al. | 216/2 |
| 2004/0266204 A1 | * | 12/2004 | Lim et al. | 438/706 |
| 2005/0269634 A1 | * | 12/2005 | Bojarczuk et al. | 257/338 |
| 2006/0255314 A1 | * | 11/2006 | Suzuki et al. | 252/79.1 |
| 2008/0044989 A1 | * | 2/2008 | Oh et al. | 438/585 |
| 2008/0264897 A1 | * | 10/2008 | Hardwicke et al. | 216/11 |

* cited by examiner

*Primary Examiner* — Duy Deo
(74) *Attorney, Agent, or Firm* — Jianq Chyun IP Office

(57) ABSTRACT

A method of patterning a metal alloy material layer having hafnium and molybdenum. The method includes forming a patterned mask layer on a metal alloy material layer having hafnium and molybdenum on a substrate. The patterned mask layer is used as a mask and an etching process is performed using an etchant on the metal alloy material layer having hafnium and molybdenum so as to form a metal alloy layer having hafnium and molybdenum. The etchant includes at least nitric acid, hydrofluoric acid and sulfuric acid. The patterned mask layer is removed.

5 Claims, 3 Drawing Sheets

METHOD OF PATTERNING METAL ALLOY MATERIAL LAYER HAVING HAFNIUM AND MOLYBDENUM

CROSS-REFERENCE TO RELATED APPLICATION

This application is a continuation application of and claims the priority benefit of a prior application Ser. No. 12/103,681, filed on Apr. 15, 2008, now pending. The prior application Ser. No. 12/103,681 claims the priority benefit of Taiwan application serial no. 96146920, filed on Dec. 7, 2007. The entirety of each of the above-mentioned patent applications is hereby incorporated by reference herein and made a part of this specification.

BACKGROUND OF THE INVENTION

1. Field of the Invention

The present invention relates to an etchant for metal alloy and an etching method using the etchant, and particularly to an etchant used for etching metal alloy having hafnium and molybdenum.

2. Description of Related Art

As the level of integration of integrated circuits increases, the dimensions of semiconductor devices decrease correspondingly. Since contact resistance is in opposite proportion to contact area, when the dimensions of transistors in metal oxide semiconductors (MOS) keep shrinking and the dimensions of a device also decrease, the contact resistance thereof increases accordingly such that the driving capability of the device is affected. Nowadays, refractory metals, refractory metal nitride and refractory metal oxide have been used in many researches and studies to replace conventional transistor materials to serve as conductive layers, dielectric layers and barrier layers.

Molybdenum and hafnium have characteristics of suitable work functions, low resistance and high thermal stability, and are therefore extensively applied in the semiconductor process. In recent years, it is found that metal alloy material having hafnium and molybdenum can be applied in fabricating N-type channel metal oxide semiconductor (MOS) transistors and P-type channel metal oxide semiconductor (MOS) transistors. However, no suitable etchant has been found so far that can etch metal alloy having hafnium and molybdenum, which has thus limited development of metal alloy having hafnium and molybdenum.

SUMMARY OF THE INVENTION

The present invention provides an etchant for etching metal alloy having hafnium and molybdenum. The etchant is capable of rapidly and effectively removing a metal alloy material having hafnium and molybdenum.

The present invention also provides a method of patterning a metal alloy material layer having hafnium and molybdenum, suitable for applications in the semiconductor process.

The present invention further provides a method of fabricating a gate structure capable of enhancing the performance of transistors.

The present invention provides an etchant used for etching a metal alloy material having hafnium and molybdenum, the etchant comprising at least nitric acid, hydrofluoric acid and sulfuric acid.

According to an embodiment of the present invention, the etchant comprises 20-80 percent by weight of nitric acid.

According to an embodiment of the present invention, the etchant comprises 1-49 percent by weight of hydrofluoric acid.

According to an embodiment of the present invention, the etchant comprises 1-96 percent by weight of sulfuric acid.

According to an embodiment of the present invention, the metal alloy material having hafnium and molybdenum is hafnium-molybdenum alloy nitride.

According to an embodiment of the present invention, the metal alloy material having hafnium and molybdenum is hafnium-molybdenum alloy nitride.

The present invention further provides an etchant used for etching a hafnium-molybdenum alloy nitride. The etchant at least comprises 20-80 percent by weight of nitric acid, 1-49 percent by weight of hydrofluoric acid, 1-96 percent by weight of sulfuric acid and 1-30 percent by weight of water.

The etchant of the present invention includes $HNO_3$, HF, $H_2SO_4$ and water. The metal alloy having hafnium and molybdenum may be removed and the metal alloy material layer having hafnium and molybdenum may be patterned with the etchant in different combinations of weight percent. Therefore, in the present invention, the metal alloy having hafnium and molybdenum with excellent work function, low resistance and high thermal stability can be utilized in fabricating MOS so as to enhance performance of transistors.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

An etchant according to the present invention is suitable for removing metal alloy having hafnium and molybdenum, such as hafnium-molybdenum alloy nitride. A composition of the etchant includes at least $HNO_3$, HF and $H_2SO_4$. In an embodiment, the composition includes 20-80 percent by weight of $HNO_3$, 1-49 percent of HF, 1-96 percent by weight of $H_2SO_4$ and 1-30 percent by weight of water, based on the total weight of the composition. The etchant is capable of completely removing conductive layers, filler layers or barrier layers using metal alloy having hafnium and molybdenum as a material thereof, for example.

According to an embodiment of the present invention, the etchant of the present invention may be used as the etchant to pattern a metal alloy material layer having hafnium and molybdenum. A composition of the etchant includes at least $HNO_3$, HF and $H_2SO_4$.

Figure 1A:
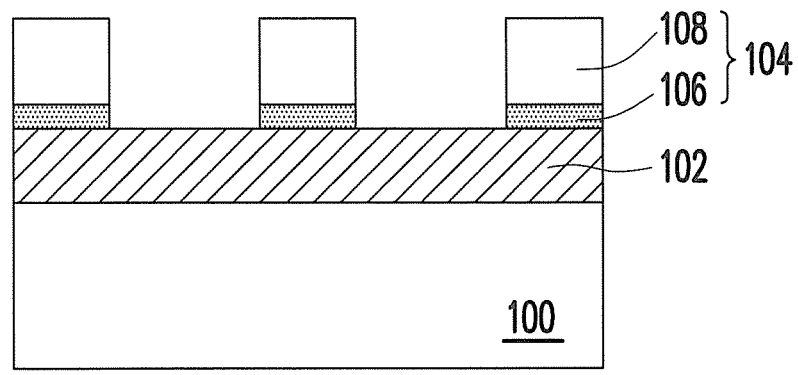
FIGS. 1A to 1B are schematic cross-sectional views of a process of fabricating a patterned metal alloy material layer having hafnium and molybdenum according to an embodiment of the present invention.
Figure 1B:
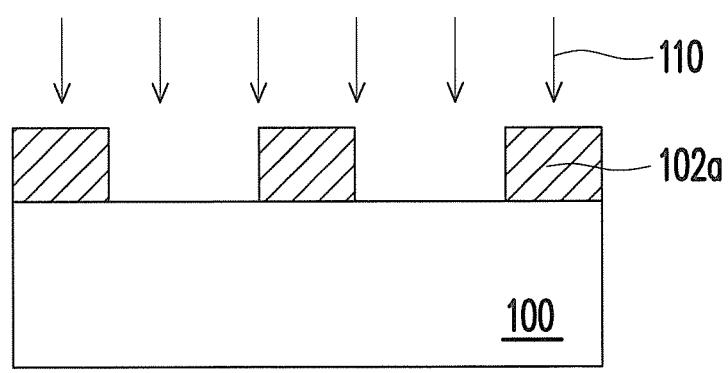

FIGS. 1A to 1B are schematic cross-sectional views illustrating a process of fabricating a patterned metal alloy material layer having hafnium and molybdenum according to an embodiment of the present invention.

Please refer to FIG. 1. First, a patterned mask layer 104 is formed on a metal alloy material layer 102 having hafnium and molybdenum on a substrate 100. The substrate 100 is, for example, an insulating material having silicon dioxide, a P-type doped silicon substrate, an N-type doped silicon substrate, an epitaxial silicon substrate, a gallium arsenide (GaAs) substrate, an indium phosphide (InP) substrate or a germanium silicide (SiGe) substrate. The metal alloy material layer 102 having hafnium and molybdenum is, for example, hafnium-molybdenum alloy nitride, and a forming method thereof on the substrate 100 is a conventional vapor deposition process. Between the substrate 100 and the metal alloy material layer 102 having hafnium and molybdenum may be disposed other devices or material layers. However, these other devices or material layers are not illustrated in the drawings. According to the present embodiment of the present invention, the patterned mask layer 104 may include a hard mask layer 106 and a photoresist layer 108. A method of forming the patterned mask layer 104 may be first depositing a hard mask material layer (not illustrated) by a chemical vapor deposition (CVD) process on the metal alloy material layer 102 having hafnium and molybdenum, for example. Afterwards, the photoresist layer 108 having a predetermined pattern is formed on the hard mask material layer. A material of the hard mask material layer is, for example, silicon nitride, amorphous silicon, polysilicon or borophosphosilicate glass (BPSG). According to an embodiment of the present invention, the predetermined pattern of the photoresist layer 108 is a pattern of a conductive line. According to another embodiment of the present invention, a predetermined pattern of the photoresist layer 108 is a pattern of a gate. Thereafter, the hard mask material layer is etched using the photoresist layer 108 as a mask, so that the predetermined pattern of the photoresist layer 108 is transferred to the hard mask material layer to form the hard mask layer 106.

Next, referring to FIG. 1B, the patterned mask layer 104 is used as a mask layer. The etchant of the present invention is used to perform an etching process 110 on the metal alloy material layer 102 having hafnium and molybdenum to form a patterned metal alloy layer 102a having hafnium and molybdenum. A composition of the etchant disclosed by the present invention includes at least $HNO_3$, HF and $H_2SO_4$. The composition includes 20-80 percent by weight of $HNO_3$, 1-49 percent by weight of HF, 1-96 percent by weight of $H_2SO_4$ and 1-30 percent by weight of water, based on the total weight of the composition. Then, the patterned mask layer 104 is removed by, for example, a wet etching process. Thus, a process of patterning the metal alloy material layer 102 having hafnium and molybdenum has been completed.

FIGS. 2A through 2D are schematic cross-sectional views illustrating a process of fabricating a gate structure according to another embodiment of the present invention.

Figure 2A:
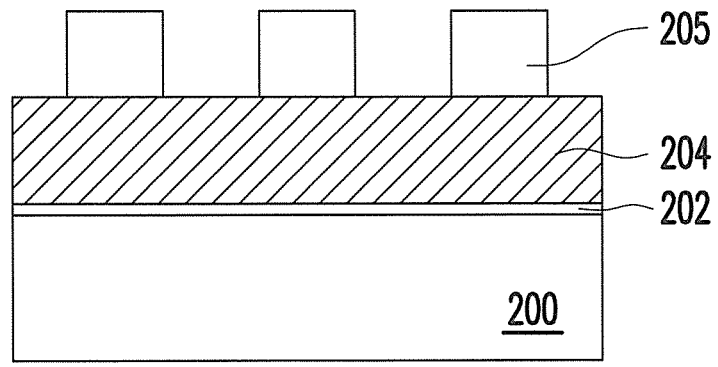
FIGS. 2A through 2D are schematic cross-sectional views illustrating a process of fabricating a gate structure according to another embodiment of the present invention.

Referring to FIG. 2A, a gate dielectric layer 202 is formed on a substrate 200. The substrate 200 is, for example, a P-type doped silicon substrate, an N-type doped silicon substrate, an epitaxial silicon substrate, a gallium arsenide (GaAs) substrate, an indium phosphide (InP) substrate or a germanium silicide (SiGe) substrate. A material of the gate dielectric layer 202 is hafnium silicon oxynitride, zirconium silicon oxynitride or silicon oxide, for example. A method of forming the gate dielectric layer 202 may be a CVD process or a thermal oxidation process. Next, a metal alloy material layer 204 having hafnium and molybdenum is formed on the gate dielectric layer 202. A method of forming the metal alloy material layer 204 having hafnium and molybdenum is, for example, a physical vapor deposition (PVD) process or a CVD process.

Figure 2B:
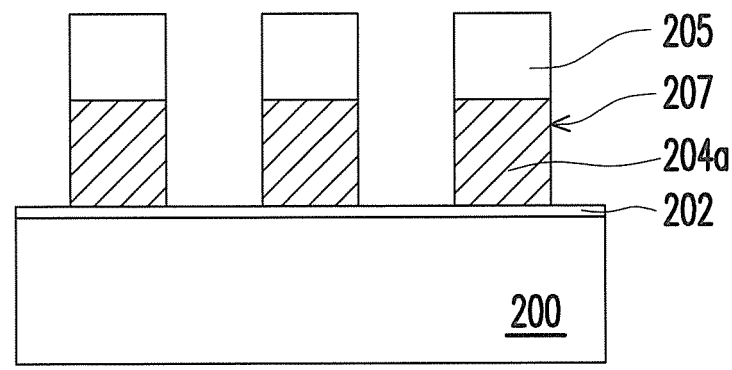

Please refer to both FIGS. 2A and 2B. Afterwards, the metal alloy material layer 204 having hafnium and molybdenum is patterned to form a patterned metal alloy layer 204a having hafnium and molybdenum. The metal alloy material layer 204 is patterned, for example, by forming a patterned mask layer 205 on the metal alloy material layer 204 having hafnium and molybdenum and etching the metal alloy material layer 204 having hafnium and molybdenum with the etchant and the patterned mask layer 205 as a mask. Please refer to the description in the previous embodiment for a forming method and a material of the patterned mask 205, and a description thereof is thus omitted herein. A composition of the etchant used herein includes at least $HNO_3$, HF and $H_2SO_4$. The composition includes 20-80 percent by weight of $HNO_3$, 1-49 percent by weight of HF, 1-96 percent by weight of $H_2SO_4$ and 1-30 percent by weight of water, based on the total weight of the composition.

Figure 2C:
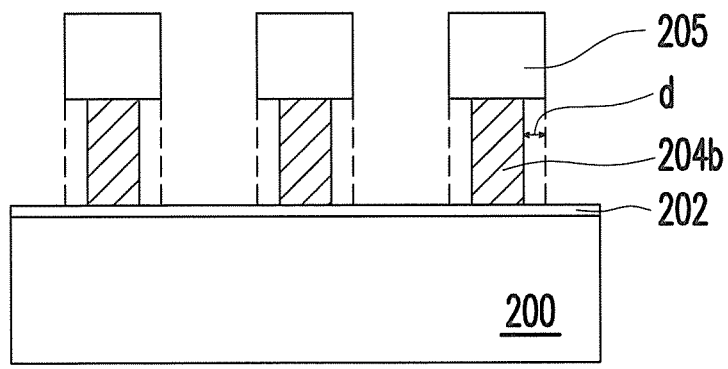

Thereafter, please refer to FIGS. 2B and 2C simultaneously. A pull-back process is optionally performed on sidewalls 207 of the metal alloy layer 204a having hafnium and molybdenum with the same etchant so that each side of the metal alloy layer 204a having hafnium and molybdenum is pulled inward a distance d to form a gate 204b. A temperature range of the etchant is 1-100° C. It should be noted that during the pull-back process, the metal alloy material remaining on the substrate 200 would also be removed, and thereby avoiding bridges derived from the metal alloy material having hafnium and molybdenum.

Figure 2D:
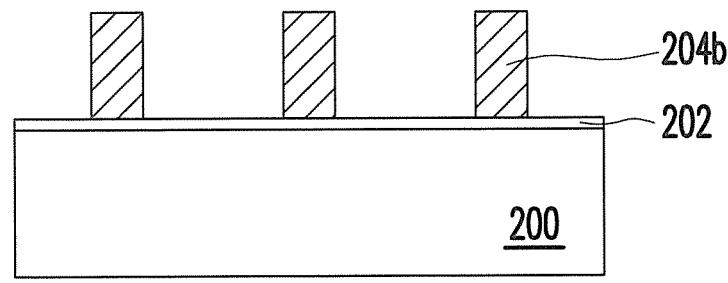

Afterwards, referring to FIG. 2D, the patterned mask layer 205 is removed. A method of removing the patterned mask layer 205 may be a wet etching process, a dry etching process or both wet and dry etching processes.

In summary, the composition of the etchant disclosed in the present invention includes at least $HNO_3$, HF, $H_2SO_4$ and water. With different percent by weight concentration combinations, the etchant can etch the metal alloy material having hafnium and molybdenum and pattern the metal alloy material layer having hafnium and molybdenum, so that the metal alloy material having hafnium and molybdenum may be applied in the process of MOS transistors. For example, the etchant may be used to form devices in the transistor such as conductive lines and gates which require conductive materials such that the advantages of metal alloy having hafnium and molybdenum, such as excellent work functions, low resistance and high thermal stability, may be well utilized to enhance the performance of the transistor.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A method of patterning a metal alloy material layer having hafnium and molybdenum, comprising:

providing a substrate, a metal alloy material layer having hafnium and molybdenum already formed on the substrate;

forming a patterned mask layer on the metal alloy material layer having hafnium and molybdenum, wherein the patterned mask layer comprises a photoresist layer and a hard mask layer is disposed below and contacts with the photoresist layer and is disposed on the metal alloy material layer having hafnium and molybdenum;

etching the metal alloy material layer having hafnium and molybdenum using the patterned mask layer as a mask with an etchant to form a metal alloy layer having hafnium and molybdenum, wherein the etchant is consisted of 20-80 percent by weight of nitric acid, 1-49 percent by weight of hydrofluoric acid, 1-96 percent by weight of sulfuric acid and water, based on a total weight of nitric acid, hydrofluoric acid, sulfuric acid and water; and removing the patterned mask layer.

2. The method of patterning the metal alloy material layer having hafnium and molybdenum as claimed in claim 1, wherein a material of the hard mask layer comprises silicon nitride (SiN).

3. The method of patterning the metal alloy material layer having hafnium and molybdenum as claimed in claim 1, wherein the substrate is an insulation layer.

4. The method of patterning the metal alloy material layer having hafnium and molybdenum as claimed in claim 1, wherein the metal alloy material layer having hafnium and molybdenum is hafnium-molybdenum alloy nitride.

5. The method of patterning the metal alloy material layer having hafnium and molybdenum as claimed in claim 1, wherein the metal alloy material layer having hafnium and molybdenum is hafnium-molybdenum alloy nitride.

* * * * *